United States Patent [19]

Angello

[11] 4,129,893
[45] Dec. 12, 1978

[54] THERMOELECTRIC GENERATOR OVERLOAD PROTECTIVE DEVICE USING HYSTERISIS CONTROL

[75] Inventor: Joseph P. Angello, Eatontown, N.J.

[73] Assignee: The United States of America as represented by the Secretary of the Army, Washington, D.C.

[21] Appl. No.: 801,938

[22] Filed: May 31, 1977

[51] Int. Cl.² .......................... H02H 7/06; H02H 3/24
[52] U.S. Cl. ........................................ 361/21; 361/92
[58] Field of Search ................ 361/20, 21, 90, 92; 310/300, 306; 322/7, 8, 10, 11, 2 R, 28

[56] References Cited

U.S. PATENT DOCUMENTS 3,656,045  4/1972  Frezzolini et al. ................ 361/92 X

OTHER PUBLICATIONS

"High Power Density Thermoelectric Power Sources" Nystrom/Angello–Proceedings of the 1971 Intersociety Energy Conversion Engineering Conference–Aug. 3–5, 1971, pp. 731–740.

Primary Examiner—Harry E. Moose, Jr.
Attorney, Agent, or Firm—Nathan Edelberg; Sheldon Kanars; Bernard Franz

[57] ABSTRACT

A thermoelectric generator is equipped with a protective device which upon overload conditions disconnects a primary load, such as a rechargeable battery, in order to protect the secondary load, i.e., the burner, fuel pump and other ancillary items necessary to operate the thermoelectric generator. The protective device includes a voltage selectable breakdown diode, a transistor switch, a relay whose coil is connected to the transistor switch and preferably an anti-clatter circuit.

10 Claims, 2 Drawing Figures

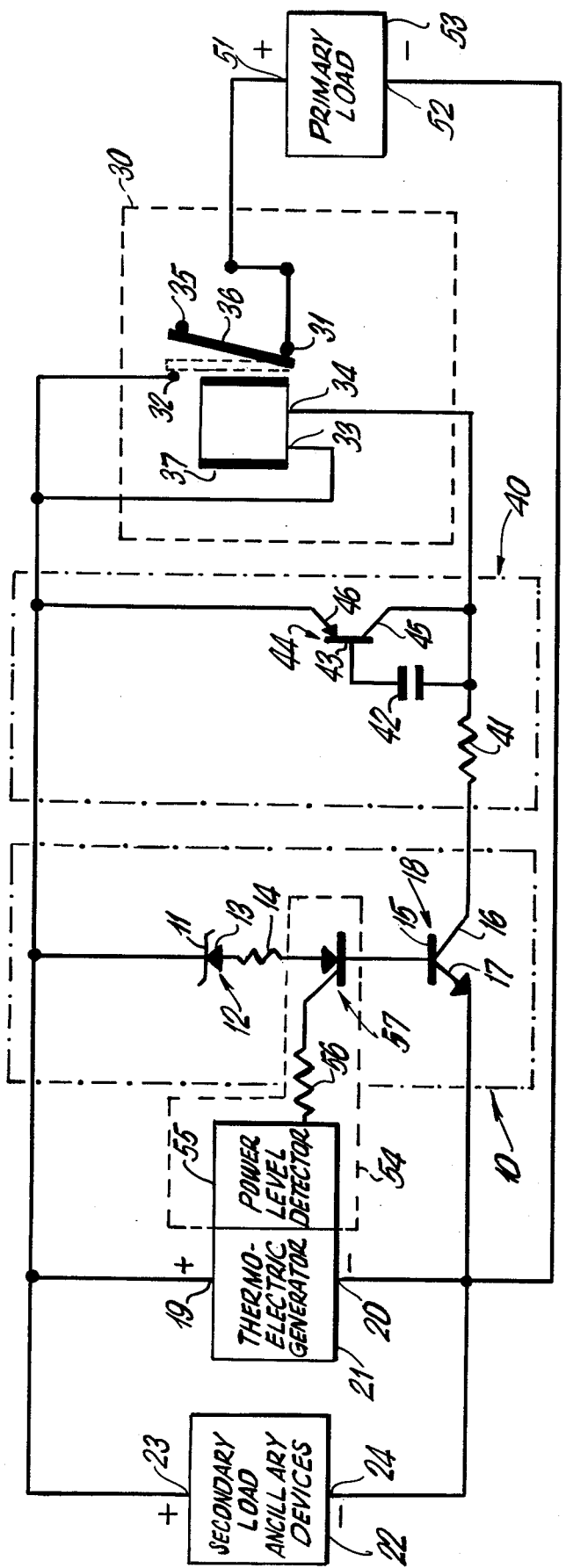
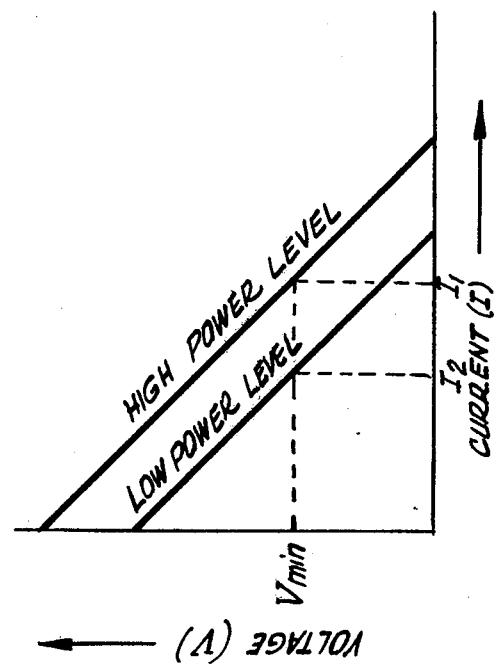
FIG. 2
FIG. 1

THERMOELECTRIC GENERATOR OVERLOAD PROTECTIVE DEVICE USING HYSTERISIS CONTROL

The invention described herein may be manufactured and used by or for the Government for governmental purposes without the payment of any royalties thereon or therefor.

BACKGROUND OF THE INVENTION

The present invention is generally related to electronic protective devices and more specifically is related to a direct current control circuit for reducing built-in relay switching hysterisis in the overload protection circuit of a thermoelectric generator.

The prior art direct current overload control apparatus suggested for use in connection with thermoelectric generators have employed solid-state switches and isolated relays. However, a solid-state switch presents a serious power loss, an output power reduction of 7-15% and, in addition, is not reversible. The isolated relays, due to their built-in hysterisis, require a relatively large input voltage reduction for resetting, which may prevent the generator from providing sufficient voltage to operate ancillary items.

In a thermoelectric generator direct conversion of heat energy into electrical power is obtained using a suitable semi-conductive material having a relatively low electrical resistance and good heat insulation. A semi-conductive material such as bismuth telluride is selected, which operates below 300° F. One portion of the material is heated and the other portion is kept relatively cool, creating a "Seebeck voltage" between the two portions. That voltage difference may be 10 millivolts for a 100° F. temperature difference. For higher temperatures, about 1000° F., one may use as the semiconductor material a lead telluride material. A series of semi-conductive thermocouples, for example, of NPN-PNP, is formed to obtain higher voltages in the range up to 100 volts or even higher. The heat may be obtained by burning liquid hydrocarbon fuels such as diesel fuel and gasoline or by burning other conventional fuels such as propane.

This type of generator is particularly important when dependability and noise are problems. The thermoelectric generator, compared to a gasoline driven piston engine and generator set, is relatively silent and dependable, maintenance-free, low in cost and may be used with a variety of fuels. For example, such thermoelectric generators may be a liquid fueled thermoelectric generator (TEG) used by the military to provide power in the 0.1 to 2.0 kW range with high reliability and total silence. The electric power obtained from the TEG generator may be sufficient to power communication equipment or to charge batteries.

The thermoelectric generator is itself a user of the electrical power it produces. Of course, the generator must be started by outside power, for example, using a battery; but, once started, it supplies its own electrical power to maintain its continued operation. The thermoelectric generator may use electrical power for "ancillary items" which constitute a "secondary load" and include such components as the electric fuel pump for the liquid fuel, the igniter to re-start the burner, the atomizer for the fuel, the cooling fan to help cool the relatively colder portions of the generator, and the blower fan to maintain proper oxidation of the fuel.

SUMMARY OF THE INVENTION

A thermoelectric generator has a primary load, such as communication equipment, and an overload control apparatus to prevent too great a drain on the generator in the event of a disturbance, such as a short circuit, of the primary load.

The ancillary items (the secondary load) of the generator are supplied with power through a separate voltage regulator (ancillary item regulator or AIR) which presents a constant load to the thermoelectric generator. The output voltage of that ancillary item regulator is set at a voltage slightly greater than the voltage minimum (Vmin) needed to operate the ancillary items.

If an overload from the primary load were to be imposed on the generator, it may not be able to supply sufficient power to the ancillary items. For example, without overload protection the fuel pump may fail and the generator shut down because the primary load becomes shorted. In addition, in some cases the generator may be harmed by a prolonged heavy load.

In the context of an overload protective device for a thermoelectric generator, the present invention utilizes a load switch (LS) control apparatus having a zener diode, a transistor and a relay. The transistor controls the relay so that the relay contacts are either "off" or "on". The transistor circuit enables the relay to reset from "on" (closed) to "off" (open) position with a minimal reduction in input voltage. For example, the transistor may be set to control the relay so that it closes when the generator is at 90% of its rated capacity and may open the relay when the generator voltage falls below the voltage needed to operate the ancillary items of the secondary load, i.e., below Vmin.

The load switch (LS) assures that a minimum voltage level (Vmin) is maintained even under the conditions of a heavy overload on the output thermoelectric generator. When the generator is overloaded to the extent that it cannot maintain a voltage greater than Vmin, the load switch automatically opens and releases the primary (external) load. The thermoelectric generator requires electrical power for start-up, for example, for its igniter to ignite the fuel, and must also be protected from errors in battery terminal connections such as reverse polarity, battery voltages less than Vmin and reversals of current. In addition to overload protection, the load switch of the present invention also provides protection from these adverse conditions.

OBJECTIVES AND FEATURES OF THE PRESENT INVENTION

It is therefore an objective of the present invention to provide an overload protective circuit for a thermoelectric generator which is operative to protect the generator and yet has a minimal power output reduction.

It is a further objective of the present invention to provide such a protective device in which there is a minimal reduction of input source voltage upon opening of the protective device.

It is a still further objective of the present invention to provide a protective device which is a means to open the circuit to the load and still provide voltage to ancillary devices.

It is a still further objective of the present invention to provide such a protective device having means to provide for fast switching with minimal reduction of source voltage.

It is a still further objective of the present invention to provide such a protective device providing for reset of a relay which is part of the protective device with minimal reduction of input source voltage.

It is a still further objective of the present invention to provide such a protective device having a means to reset relay contacts which are part of the protective device with minimal input voltage variations.

It is a still further objective of the present invention to provide such a protective device in which the current flow to relay and load is controlled by means of the input source voltage.

It is a still further objective of the present invention to provide such a protective device having a means to provide for fast switching of the relay part of the protective device and the load circuit.

It is a feature of the present invention to provide an overload protection system for the protection of a generator, especially a thermoelectric generator, when the primary load to which the generator is attached imposes an excessive load. The generator has first and second output terminals, usually positive and negative terminals, which are connected to the load switch protective device and are also connected to a secondary load. For example, the secondary load (ancillary items) may be the fuel injector and other electrical components necessary to operate the thermoelectric generator. The generator remains connected to, and supplies power to, the secondary load even after the generator is disconnected from the primary load because of an overload condition.

The load switch protection device includes a relay having a control coil and a set of contacts. The contacts have "open" and "close" positions and are controlled by the relay control coil. The close contact position of the set of contacts connects the primary load to the generator and their open contact position disconnects the generator from the primary load. The control device further comprises a transistor switch having a base control electrode, a collector and an emitter. A voltage selectable breakdown diode, for example, a zener diode, has one terminal connected to the first generator terminal and its other terminal connected to the transistor base electrode. The transistor emitter is connected to the second generator terminal and the transistor collector is connected to the relay control coil. For example, the diode terminal connected to the relay coil may be its anode terminal and the diode terminal connected to the transistor may be its cathode terminal.

Preferably a resistor is connected in series between the transistor base and the other terminal of said diode and, in one example, the transistor is an NPN transistor.

Other objectives, features and advantages of the present invention may be ascertained by a reading of the specification and appended claims in conjunction with the drawings, wherein:

FIG. 1 is a graph showing voltage and current of the thermoelectric generator; and FIG. 2 is a schematic diagram of the preferred embodiment of the circuit of the present invention.

DETAILED DESCRIPTION OF THE INVENTION

Current actuated overload protective devices, such as fuses or circuit breakers, are not suitable for overload protection of a thermoelectric generator. Such current sensitive devices cannot be used because the current produced by thermoelectric generators is not constant. The power generated by a thermoelectric generator is a function of the amount of heat supplied by the burner and the cooling provided by the ambient environment. Generally the heat of the burner depends upon the rate of fuel injected into the burner. By regulating the rate of the injected fuel, it is possible to generate low power, high power, or intermediate levels of power.

As shown in FIG. 1, which plots the voltage and current outputs of the thermoelectric generator, the curve representing the minimum voltage to operate the ancillary devices (secondary load) $V_{min}$ intersects the high power level characteristic curve of the thermoelectric generator (TEG) at $I_1$ and intersects the lower power level generator characteristic curve at $I_2$. A set of intermediate TEG characteristic curves (not shown) may be obtained by adjusting the burner temperature. The $V_{min}$ value would intersect those intermediate power level curves at different levels of current. Consequently, a current sensitive overload protective device would not provide for the $V_{min}$ to operate the ancillary devices under all conditions.

The load switch (LS) protective device of the present invention is voltage actuated. The protective device of the present invention has a fast response time, so that it will open immediately and prevent voltages lower than $V_{min}$ from appearing across the input of the secondary load voltage regulator (AIR input). Such a low voltage, if it were permitted to there appear, may cause the ancillary devices to operate at reduced performance and shut down the thermoelectric generator.

The present invention is illustrated in connection with the electronic limit switch shown in FIG. 2. As shown in FIG. 2, in the limit switch circuit the cathode 11 of the voltage breakdown diode, zener diode 12, is connected to the positive d.c. output terminal 19 of the thermoelectric generator 21 (TEG). The anode 13 of the zener diode 12 is connected through resistor 14 to the control electrode base 15 of NPN transistor 18. The emitter 17 of transistor 18 is connected to the negative d.c. output terminal 20 of the thermoelectric generator 21.

The zener diode 12 is selected so that its breakdown voltage is about at the voltage selected to operate and open the relay of the limit switch circuit 10. A zener diode is a two-terminal semiconductor junction device with a very sharp voltage breakdown in the reverse-bias region. For example, a zener diode of type IN967B will block the flow of current below a voltage of 18 volts and pass a flow of current above that voltage.

The relay 30 is a voltage-activated, normally open relay. An example of a suitable relay would be type FC215-450, rated at 300 ohm coil, of S. Dunn Inc. The relay coil terminal 33 of the relay 30 is connected to the positive d.c. output terminal 19 of thermoelectric generator 21. The thermoelectric generator 21 would typically produce voltage in the maximum range of 20 to 30 volts and may, for example, be of 0.5 kW rating and be rated within the range of 0.1 kW to 1.5 kW.

The terminal 34 of relay coil 37 of the relay 30 is connected to the collector 16 of the transistor 18. The contact terminal 31 of the relay 30 is connected to the positive terminal 51 of the primary load 53, which may, for example, be a rechargeable battery or communication equipment. The contact terminal 32 of the relay 30 is connected to the positive terminal 19 of the thermoelectric generator 21.

The operation of the protective circuit of the present invention may be seen by reference to FIG. 2. Referring now to FIG. 2, it will be noted that for voltages greater than the breakdown voltage level (voltage reference level) of zener diode 12, the base 15 of transistor 18 will experience sufficient current to saturate and to switch transistor 18 "on" and allow current to flow to relay coil 37 from the generator 21. The voltage reference level is set, by the proper choice of the zener diode 12, so that it is above the voltage required by the relay coil 37 to operate its relay armature 36 (relay moving member). The transistor performs two functions: first, it operates as a switch to control power to the relay coil and, secondly, due to its high $BV_{ceo}$, it provides protection to the generator 21 against a reverse voltage, for example, because someone wrongly reversed the terminals of a battery which is the primary load. When the relay 30 is in a closed position, the primary load 53 will receive almost the full voltage from the generator 21. The open relay position is shown in the dark line position of armature 36 and its closed position is indicated by the dashed lines for armature 36. However, should load 53 draw excessive current and attempt to overload the thermoelectric generator 21, for example, under a short-circuit condition, relay 30 will "open", disconnecting the load 53 from the generator 21. The resetting of the relay 30 to a "closed" position is accomplished by means of the limit switch circuit 10 of FIG. 2.

A minimum reduction of input voltage below the zener reference value will de-activate transistor 18 and switch relay 30 to an "off" position shown with armature 36 establishing contact between the contact terminals 31 and 35. This enables relay 30 to establish its normally "open" status, as illustrated in FIG. 2 by the armature in full dark lines positioned to establish contact between relay terminals 35 and 31. A subsequent minimal increase in generator output voltage above the breakdown voltage of zener diode 12 will re-activate transistor 18, "close" the relay as shown by the dashed lines of armature 36, and again allow current to flow through relay terminals 32, 31 to the primary load 53.

The positive terminal 19 of the thermoelectric generator 21 is connected to the positive terminal of the secondary load 23 and the negative generator terminal 20 is connected to the negative load terminal 24. The secondary load, which comprises the ancillary items needed to maintain power generation, such as the fuel pump and igniter, may also contain an ancillary item voltage regulator (AIR), not shown. The secondary load 22 remains connected to, and receives power from, the generator 21 even when the primary load 53 has been disconnected from the generator 21 by the opening of the relay 30.

A circuit 40 to prevent clatter of the relay contacts is preferably provided as an integral part of the present invention. The anti-clatter circuit 40 comprises resistor 41 and capacitor 42 connected to the base terminal 43 of transistor 44. The transistor 44 is of the PNP type and has its collector 45 connected to the resistor 41 and its emitter 46 connected to the positive terminal 19.

The relay clatter, in the absence of the anti-clatter circuit 40, may occur if an overload condition of the primary load 53 causes the relay 30 to open and disconnect the load 53. Without load 53 the generator 21 voltage will rise toward the reference voltage (breakdown voltage of zener diode 12), thereby closing the relay and reconnecting the load. If the overload condition is still present, the disconnect-reconnect cycle will continue. The anti-clatter circuit 40 delays the closing of the relay. In one embodiment of the present invention, using the specific components listed below, the rise time to close the relay contacts and to connect the load was relatively large (3.6 seconds) compared to the fall time (0.1 second) to open the relay contacts and disconnect the load. Under a continued overload condition the relay, with anti-clatter circuit 40, will continue to cycle in a disconnect-reconnect cycle. However, the speed of such cycling is reduced by the anti-clatter circuit 40.

Another thermoelectric generator protection has been incorporated into the relay load switch of the present invention to insure that the generator 21 is ready to accept a primary load 53 before the relay 30 closes. When the thermoelectric generator 21 output reaches 90% of its selected power level, its output voltage and current level is sensed and triggers a logic signal. This logic signal is used to override the relay drive circuit actuation signal determined by the $V_{min}$ value.

FIG. 2 shows the circuit 54 necessary to incorporate the override feature. The circuit 54 includes the power level detector 55 connected to generator 21 which provides a logic signal as a preset level of power of the generator 21, a resistor and an SCR (silicon controlled rectifier) 57 whose control electrode is connected to resistor 56 and which controls the flow of current between resistor 14 and the base 15 of transistor 18. The relay coil current cannot flow until the SCR 57 is triggered by the signal representing the 90% power level of the generator. After the SCR 57 is triggered through resistor 56, control circuit 10 then controls the open/close state of the relay 30 by monitoring the effect of the primary load conditions.

The components and values of one tested embodiment of the present invention are as follows: transistor 18 type 2N1506A; capacitor 42 of 100 microfarads; transistor 44 type 2N5880; resistor 56 of 5600 ohms; resistor 14 of 3300 ohms; SCR 57 type 2N234A; resistor 41 of 220 ohms; diode 12 type IN3026B.

In one embodiment of this circuit, the voltage difference required, i.e., the reduction/increase of input voltage, was 0.1 volt. In contrast, as in the prior art, if the relay were to be directly employed as an isolated overload device, the input voltage reduction required for its resetting may be 7 volts. The present invention, using the illustrated diode-transistor combination to switch the relay "on" and "off", reduces the normal built-in hysterisis of the relay and allows the input power to be maintained at a sufficiently high level to operate the secondary load 22 (ancillary items).

Further, most of the loss of current is due to the relay and not to its control circuit. In one embodiment of the present invention, the relay control circuit 10 draws only 9 milliamps at 25 volts, or 0.225 watt.

It may also be supposed that a completely solid state electronic overload protective device may be built to avoid the use of a relay. However, the power losses in such a solid-state device may be greater than the relay solid-state circuit of the present invention. For example, a completely solid-state device, it has been calculated, using a silicon transistor would have a power loss of about 11% or more compared to the overload protective device of the present invention.

What is claimed is:

1. An overload protection system including a generator, a load switch protective device and a primary load to which the generator is normally connected and from which it is disconnected upon an overload condition by the load switch protective device, and a secondary load, wherein the generator has first and second output terminals connected to the protective device and connected to the secondary load to which secondary load said output terminals remain connected even after being disconnected from the primary load by the protective device, wherein said protective device is connected to the primary load, wherein the load switch protective device comprises a relay having a control coil and a set of contacts having open and close positions and controlled by the control coil, the close contact position of the set of contacts connecting the primary load to the generator and their open contact position disconnecting the generator from the primary load, characterized in that the load switch protective device further comprises a transistor switch having a base control electrode, a collector and an emitter and a voltage selectable breakdown diode having one terminal connected to the first generator terminal and its other terminal connected to said transistor base electrode, wherein said transistor emitter is connected to the second generator terminal and said transistor collector is connected to the relay control coil;

further comprising an anti-clatter circuit to prevent clatter of the relay contacts and comprising a second transistor and a time delay device connected to the control electrode of said second transistor, said second transistor having its collector-emitter in parallel with said relay coil.

2. A system as in claim 1 wherein said diode terminal connected to said first generator terminal is its anode terminal and said diode terminal connected to said transistor base is its cathode terminal.

3. A system as in claim 2 and further comprising a resistor connected in series between said transistor base and said cathode terminal of said diode.

4. A system as in claim 1 wherein said generator is a thermoelectric generator.

5. A system as in claim 2 wherein said transistor is an NPN transistor.

6. A system as in claim 2 wherein said diode is a zener diode.

7. An overload protection system as in claim 1, wherein said diode is a zener diode, and further comprising a silicon controlled rectifier device connected in series between the zener diode and said base control electrode of said transistor switch, the silicon controlled rectifier having a control electrode coupled to a power level detector to trigger it when the power level of the generator reaches a predetermined percentage level, so that the transistor switch cannot enable the relay current to flow until said percentage level is attained by the generator.

8. An overload protection system including a thermoelectric generator, a protective device, a primary load to which the generator is normally connected and from which it is disconnected upon an overload condition by the protective device, and a secondary load, said generator having first and second output terminals connected to the protective device and connected to a secondary load, said output terminals remaining connected to said secondary load even after being disconnected by the protective device from the primary load under overload conditions, said protective device comprising a relay having a control coil and a set of contacts having open and close positions, said contacts being controlled by the control coil, the said close contact position connecting the primary load to the generator and the said open contact position disconnecting the generator from the primary load, a transistor switch having a base control electrode, a collector and an emitter, a resistor having first and second terminals, a zener diode having its cathode terminal connected to the first generator terminal and its anode terminal connected to said first resistor terminal, said transistor emitter being connected to the second generator terminal, said transistor collector being connected to the relay control coil, and the transistor base being connected to said second resistor terminal;

further comprising an anti-clatter circuit to prevent clatter of the relay contacts and comprising a second transistor and a time delay device connected to the control electrode of said second transistor, said second transistor having its collector-emitter in parallel with said relay coil.

9. A system as in claim 8 wherein said transistor is an NPN transistor.

10. An overload protection system as in claim 8, further comprising a silicon controlled rectifier device connected in series between the zener diode and said base control electrode of said transistor switch, the silicon controlled rectifier having a control electrode coupled to a power level detector to trigger it when the power level of the generator reaches a predetermined percentage level, so that the transistor switch cannot enable the relay current to flow until said percentage level is attained by the generator.

* * * * *